United States Patent [19]
Andersen

[11] Patent Number: 5,578,963
[45] Date of Patent: Nov. 26, 1996

[54] INTEGRATED AMPLIFIER WITH FLAT GAIN FOR HIGH AND LOW IMPEDANCE LOADS

[75] Inventor: Henning H. Andersen, Hørsholm, Denmark

[73] Assignee: Topholm & Westermann APS, Vaerlose, Denmark

[21] Appl. No.: 397,223

[22] PCT Filed: Nov. 6, 1993

[86] PCT No.: PCT/EP93/03109

§ 371 Date: Mar. 8, 1995

§ 102(e) Date: Mar. 8, 1995

[87] PCT Pub. No.: WO94/15397

PCT Pub. Date: Jul. 7, 1994

[30] Foreign Application Priority Data

Dec. 19, 1992 [DE] Germany .................. 42 43 009.7

[51] Int. Cl.⁶ .................................................. H03F 3/45
[52] U.S. Cl. ................................ 330/252; 330/260
[58] Field of Search .............................. 330/252, 260, 330/254, 261

[56] References Cited

U.S. PATENT DOCUMENTS 3,582,802  6/1971  Weekes et al. .................... 330/30
3,946,325  3/1976  Leidich ............................ 330/22
5,479,137  12/1995  Harford ........................ 330/260 X

FOREIGN PATENT DOCUMENTS 0121027  10/1984  European Pat. Off. .

OTHER PUBLICATIONS

"Novel CMOS Linear OTA Using Feedback Control on Common Source Node", Electronics Letters, vol. 27, No. 20, Sep. 1991, pp. 1873–1875.
"A 250–MHz Monolithic Voltage–Controlled Oscillator with Low Temperature Coefficient", IEEE Journal of Solid–State Circuits, vol. 25, No. 2, Apr. 1990, pp. 555–561.

Primary Examiner—Steven Mottola
Attorney, Agent, or Firm—Sughrue, Mion, Zinn, Macpeak & Seas

[57] ABSTRACT

The invention relates to a circuit arrangement for an integrated output amplifier (1) with two constant current sources (2, 3), a voltage amplifier with two inputs (5, 6) and two outputs (7, 8) and two output transistors (Q1, Q2) coupled with these, as well as two feedback networks (9, 10) producing negative feedback which are connected between the output transistors and the corresponding input transistors of the voltage amplifier (4). The first two feedback networks (9, 10) are connected between the collectors of the output transistors (Q1, Q2) and the base electrodes of the corresponding input transistors of the voltage amplifier (4). In addition, a third feedback network (11) is connected on the input side to the base electrodes of the output transistors and on the output side to the input of a current splitting network (16) via a transistor (Q3) acting as a current sink, whereby said current splitting network has a signal input (17). The current splitting network (16) has two parallel branches (18, 19), between which the current flowing through this network can be split, whereby this is controlled by the signal present at the signal input (17), and whereby the branches (18 and 19) of the current splitting network (16) are connected on the one hand with the constant current sources (2 and 3) and on the other hand with the inputs of the voltage amplifier (4).

4 Claims, 4 Drawing Sheets

INTEGRATED AMPLIFIER WITH FLAT GAIN FOR HIGH AND LOW IMPEDANCE LOADS

BACKGROUND OF THE INVENTION

The invention relates to a circuit arrangement for an integrated output amplifier with two essentially identical constant current sources, an integrated voltage amplifier with two inputs and two outputs and essentially identical output transistors coupled with these, as well as two essentially identical negative feedback networks between the output transistors and the correspondingly assigned input transistors of the voltage amplifier.

Such highly integrated circuits are particularly suitable for output amplifiers with a relatively low power output, such as those which can be used in hearing aids.

As is generally known, the gain normally changes greatly with the output current at very low output impedances if the output-side load is a largely inductive load with a DC resistance of 50 Ohm and an AC resistance at 800 Hz of around 100 Ohm.

Such a circuit is known, for example, from U.S. Pat. No. 4,085,382. Here, a directly coupled integrated class B amplifier with a low power rating is described, whereby this consists of a three-stage two-channel pre-amplifier and a pair of output transistors, one for each channel. A negative feedback loop is provided in each channel which connects the collector of the transistor in the last stage of the preamplifier with the base electrode in the first stage of the pre-amplifier and thus controls the direct current level.

A negative, resistive AC voltage feedback loop connects the collector of one output transistor in each case with the collector of the corresponding first pre-amplifier transistor in order to reduce the gain dependence of the respective channel on the current flowing through the output transistor. This is intended to reduce the closed circuit currents in the output transistors.

However, these amplifiers have a relatively high gain of more than 40 dB.

However, this circuit is not without problems. Firstly, it requires too many and too large external components, e.g. two capacitors in the microfarad range and one capacitor in the nanofarad range for stabilization.

In addition, the power requirement is too high and the output power obtained from this is too low. Although it is always attempted to keep the closed-circuit current of the output transistors as low as possible, high distortions are obtained for a load with low impedance if this current is reduced too much. The better the output transistors are driven into the saturation region, the lower the amount of power tapped from the voltage source which is lost in the amplifier.

In the known circuit, the output transistors are controlled passively, i.e. by a resistor, and the level is kept low in order to limit the closed-circuit current. However, the result of this is that the saturation of the output transistors is insufficient. In addition, although the input-side noise is low with the known amplifier, the overall gain factor is high (greater than 40 dB), and this means in turn that the signal-to-noise ratio is not very good at a low gain setting.

SUMMARY OF THE INVENTION

It is not possible to reduce the gain of the output stage, however, since otherwise the input stage will be driven into saturation before the output stage.

It is the object of the invention to improve a circuit arrangement of the type mentioned above in such a way that it is possible to achieve a lower closed-circuit current with fewer external components and to obtain a high modulation capability with low distortion for an average gain of e.g. 20 to 30 dB.

BRIEF DESCRIPTION OF THE DRAWINGS

The invention will now be described in greater detail on the basis of an example embodiment in conjunction with the enclosed drawings.

In the drawings.

DETAILED DESCRIPTION OF THE PREFERRED EMBODIMENT

Figure 1:
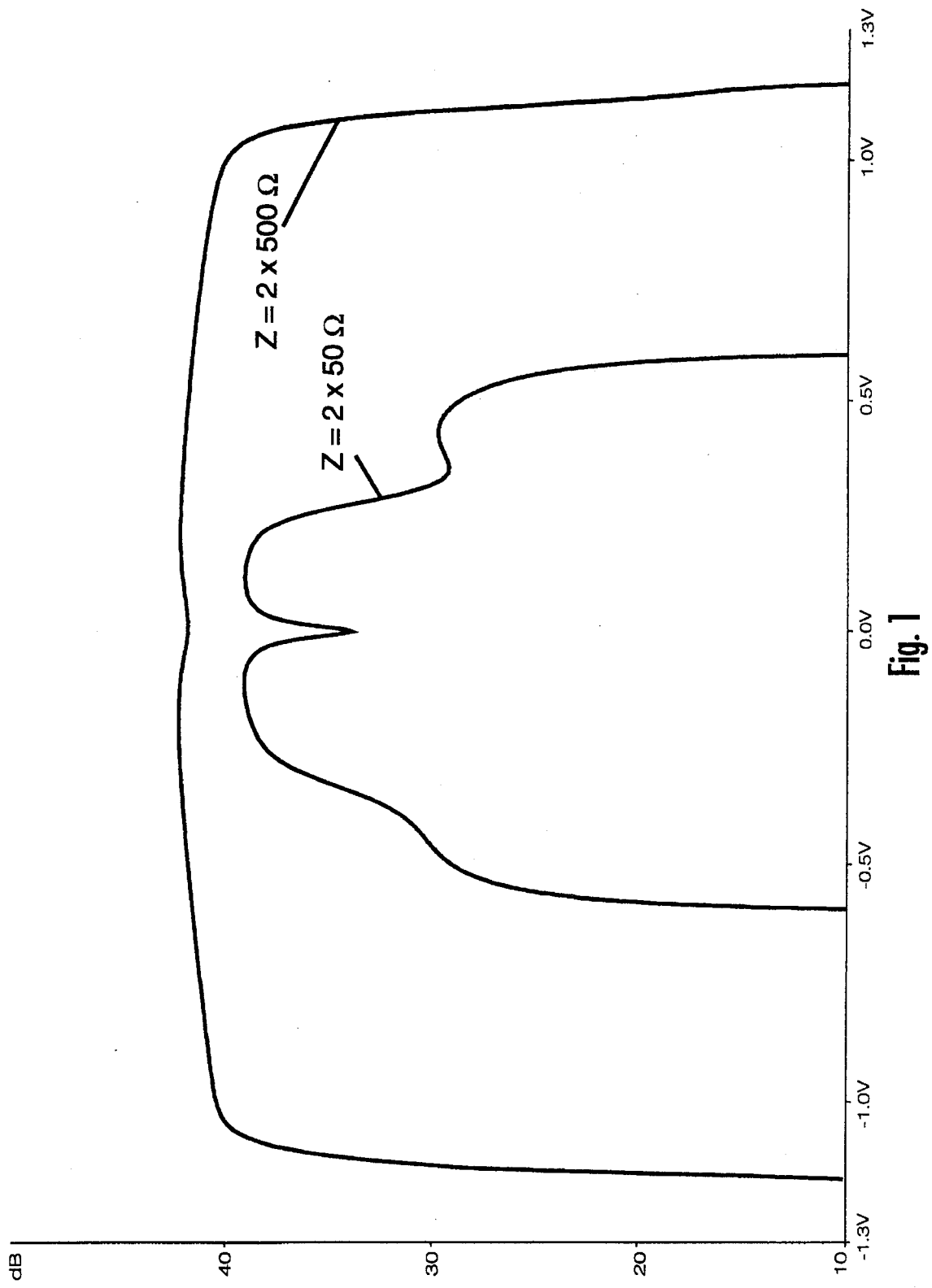
FIG. 1 shows the gain characteristic at small signal amplitudes as a function of the voltage applied to the load for two impedance values as the state of the art.

It is possible to see from the characteristic of the individual curves in FIG. 1 that the differences between a load resistance of 50 Ohm and a load resistance of 500 Ohm are quite drastic. It must therefore be possible to improve this characteristic of an output amplifier.

Figure 2:
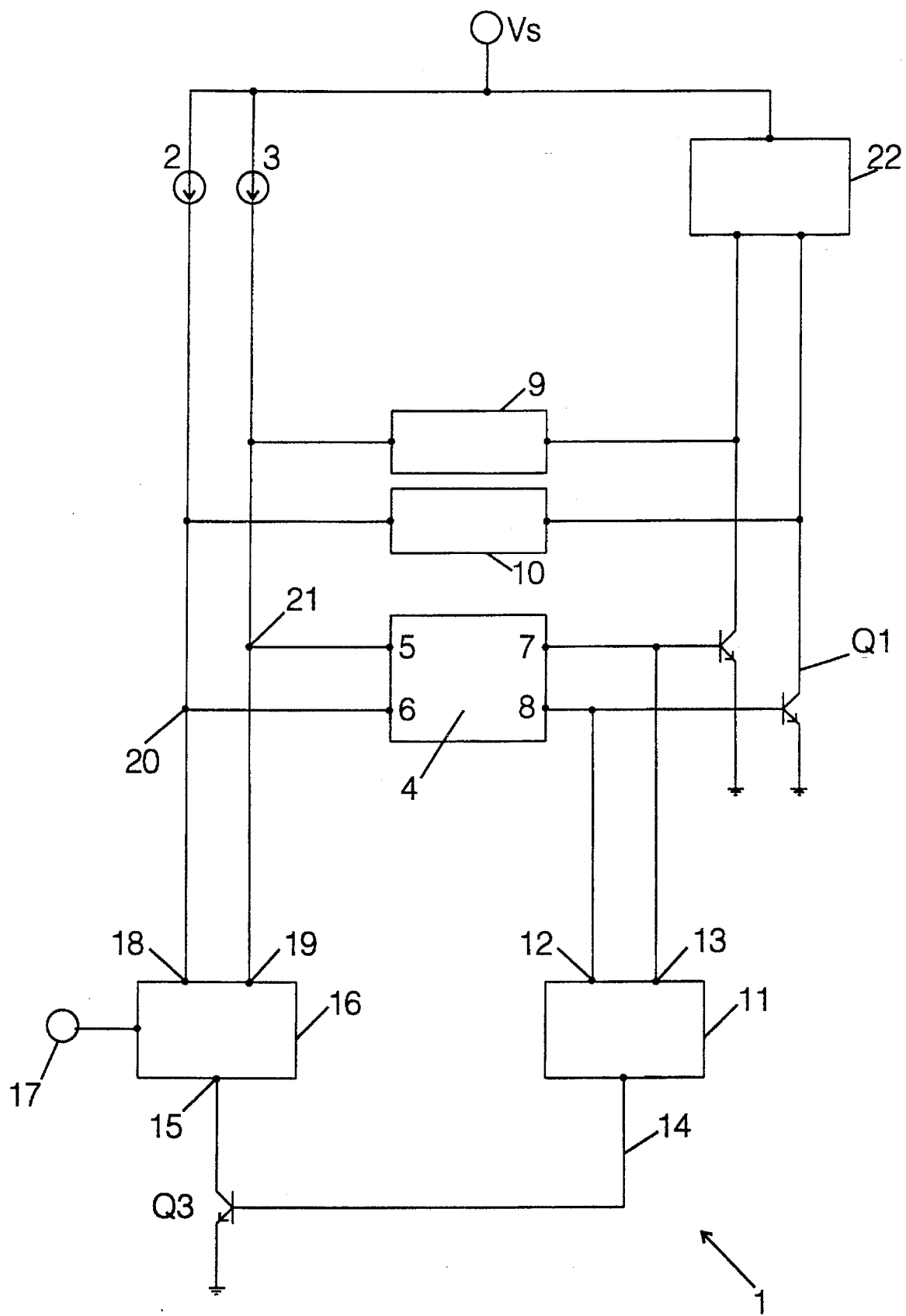
FIG. 2 shows a greatly simplified schematic diagram of the new output amplifier.

FIG. 2 initially shows the greatly simplified schematic diagram of the invention. In output amplifier 1, a voltage source Vs feeds two constant current sources 2 and 3, which in turn feed a voltage amplifier 4 with two inputs 5 and 6 as well as two outputs 7 and 8. This voltage amplifier drives two power transistors as output transistors Q1 and Q2. In addition, two feedback networks 9 and 10 are connected here which are in turn connected with the conductors routed from the collectors of the output transistors to the load. A further feedback network 11 is connected to the output of the voltage amplifier and the conductors routed to the base electrodes of the output transistors with the two inputs 12 and 13. In addition, a bias voltage source Vv is also suggested.

The output 14 of the feedback network is connected with the base electrode of a transistor Q3 functioning as a current sink. The emitter electrode of Q3 is connected to ground. The collector of Q3 is connected to an input 15 of a current splitting network 16. The latter also possesses a signal input 17. Two parallel conductors are connected to the outputs 18 and 19 of this current splitting network, and these are routed to the connection points 20 and 21 of the conductors from the constant current sources. The output of the power transistors Q1, Q2 is connected with a load 22, which is preferably the primary winding of an output transformer provided with a center tap.

Figure 3:
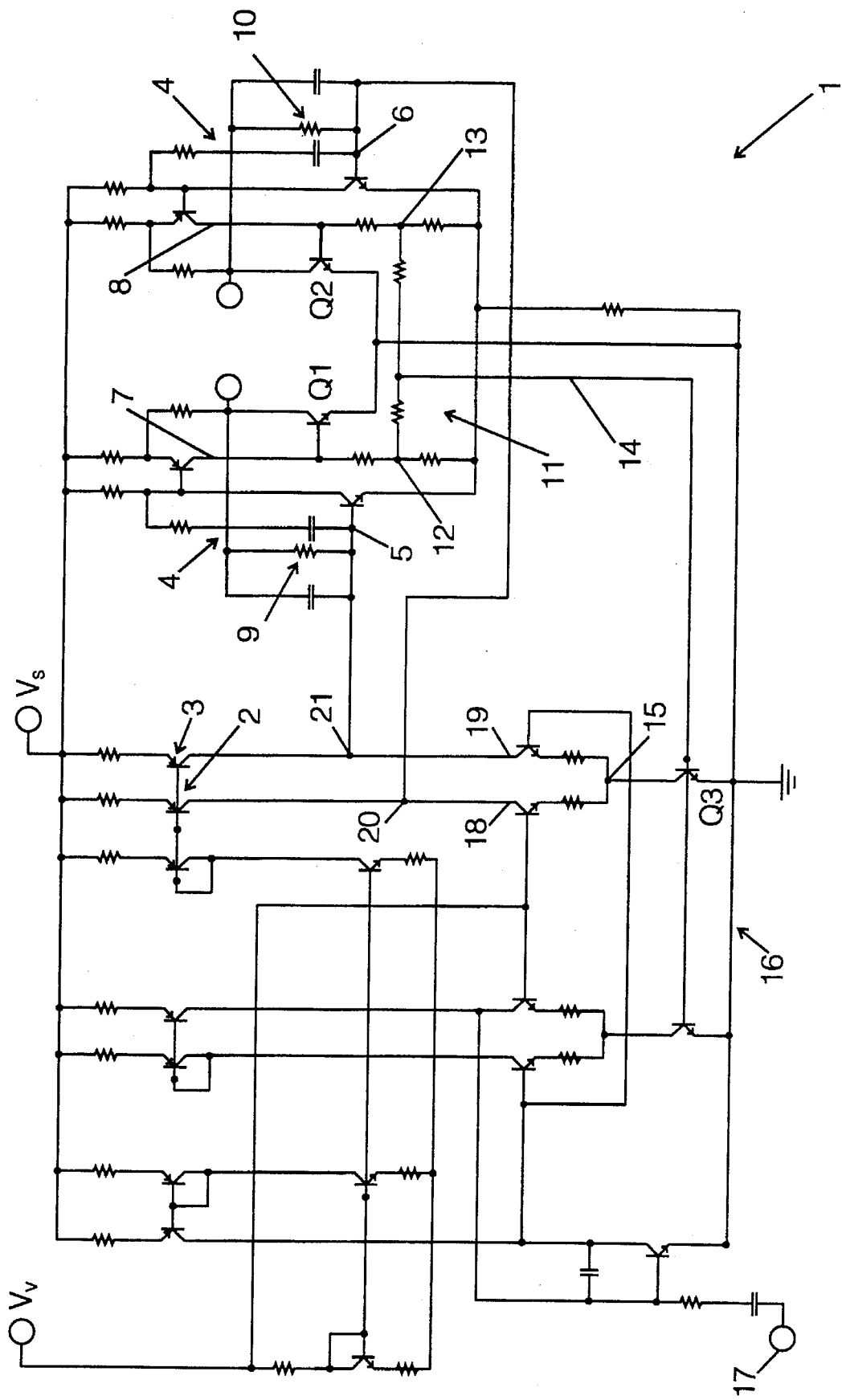
FIG. 3 shows a simplified schematic diagram of the output amplifier in accordance with the invention and FIG. 4 shows the gain characteristic for small signal amplitudes as a function of the voltage applied to the load for two impedance values for a circuit designed in accordance with the invention.

This schematic diagram will now be explained in more detail with reference to FIG. 3, whereby the same parts have the same reference numbers and therefore do not need repeating.

The output amplifier has two almost identical constant current sources 2 and 3, a current splitting network 16, two almost identical feedback networks 9 and 10, a voltage amplifier 4 with two inputs and two outputs, two almost identical output transistors Q1 and Q2 as well as a further feedback network 11 and a transistor Q3 functioning as a current sink.

The constant current sources 2 and 3 supply a constant current to the nodal points 20 and 21. The transistor Q3 draws current to ground via the nodal point or input 15 of the current splitting network, whereby the current is split between the two branches 18 and 19.

The splitting ratio is controlled by the input signal at the input terminal 17 in such a way that the difference in the currents in the two branches 18 and 19 is proportional to the signal present at the input terminal 17. If the signal amplitude at the input 17 is high, the current flowing in the branch 18 goes to zero, while all the current flowing through the transistor Q3 flows through the branch 19. The opposite conditions are obtained if there is a correspondingly high opposite signal amplitude at input 17, i.e. all the current flowing through transistor Q3 will flow into branch 18, while branch 19 will not carry any current.

The voltage amplifier 4 has a non-inverting gain such that the total of the output voltages is determined by the total of the input voltages. The amplifier also has a differential gain such that the difference in the voltages at the outputs 7 and 8 is determined by the difference in the voltages at the inputs 5 and 6.

The output transistors Q1 and Q2 are controlled at their base electrodes, the emitter electrodes are connected to ground and the collectors are connected to the load.

Negative feedback is realized by way of the feedback networks 9 and 10. Each of these networks converts the voltage present at a collector into a current which is supplied to the input of the voltage amplifier. This arrangement ensures that the voltage across the load is proportional to the difference in the currents at the outputs 18 and 19, thus guaranteeing the proportionality between the input signal and the voltage across the load.

The feedback network 11 has two inputs 12 and 13 and one output 14. The output voltage of this network is controlled by the average voltage of the input voltages at the terminals 5 and 6, whereby there may be a small bias voltage.

The voltage present at output 14 of the feedback network is supplied to the base of transistor Q3, whereby a transistor of the same type is used here, but this will very probably be of a different order of magnitude than Q1 and Q2.

The feedback loop with the feedback network 11 controls the collector current of Q3 so that this current is the same as the total current from the constant current sources 2 and 3, plus the total of the currents originating from the feedback networks 9 and 10.

Since the voltage at the base electrode of Q3 is the same as the base voltages at the output transistors Q1 and Q2 when no input signal is present (possibly with a slight shift), this voltage also controls the closed-circuit current of Q1 and Q2. If an input signal occurs, the base voltages of Q1 and Q2 deviate from the value of the closed-circuit current by approximately the same values with opposite polarity.

In principle, this circuit initially functions without limitation of the output power at the maximum possible power for the given operating voltage and subject to the unavoidable limits placed by the circuit itself. However, such limitation of the output power could be achieved by correspondingly limiting the currents supplied by the constant current sources 2 and 3. The voltage amplitude at the collector of Q1 and Q2 is reduced if the current is set at a level which is not sufficient to produce the full amplitude at the feedback networks 9 and 10.

The output transistors can be driven into the saturation region if the currents supplied by the constant current sources are high enough.

The transistors Q1, Q2 and Q3 are represented as bipolar NPN transistors in the schematic circuit diagrams. The circuit would naturally also function in the same way if PNP transistors were used, subject to a corresponding battery polarity, but NPN transistors are normally better suited for integrated circuits.

The circuit arrangement would also function with N-channel or P-channel field effect transistors.

The new circuit arrangement has fulfilled all the demands placed above, as has been confirmed by tests and measurements.

First of all, it was possible to dispense with the large, external capacitors by not limiting the output power under the maximum possible value. Such a limitation could, for example, be achieved by limiting the currents supplied by the constant current sources. In this case, a capacitor in the nanofarad range could be used if required for decoupling.

If FIG. 1 is considered in this context, this demonstrates the behavior of a known circuit connected to a load, which may consist, for example, of the primary winding of an output transformer with a center tap.

The gain characteristic shows a deep dip at a low impedance of Z=2×50 Ohm, such as is obtained at low frequencies. In addition, the gain already drops steeply to both sides at an amplitude of −0.6 V or+0.6 V respectively.

Figure 4:
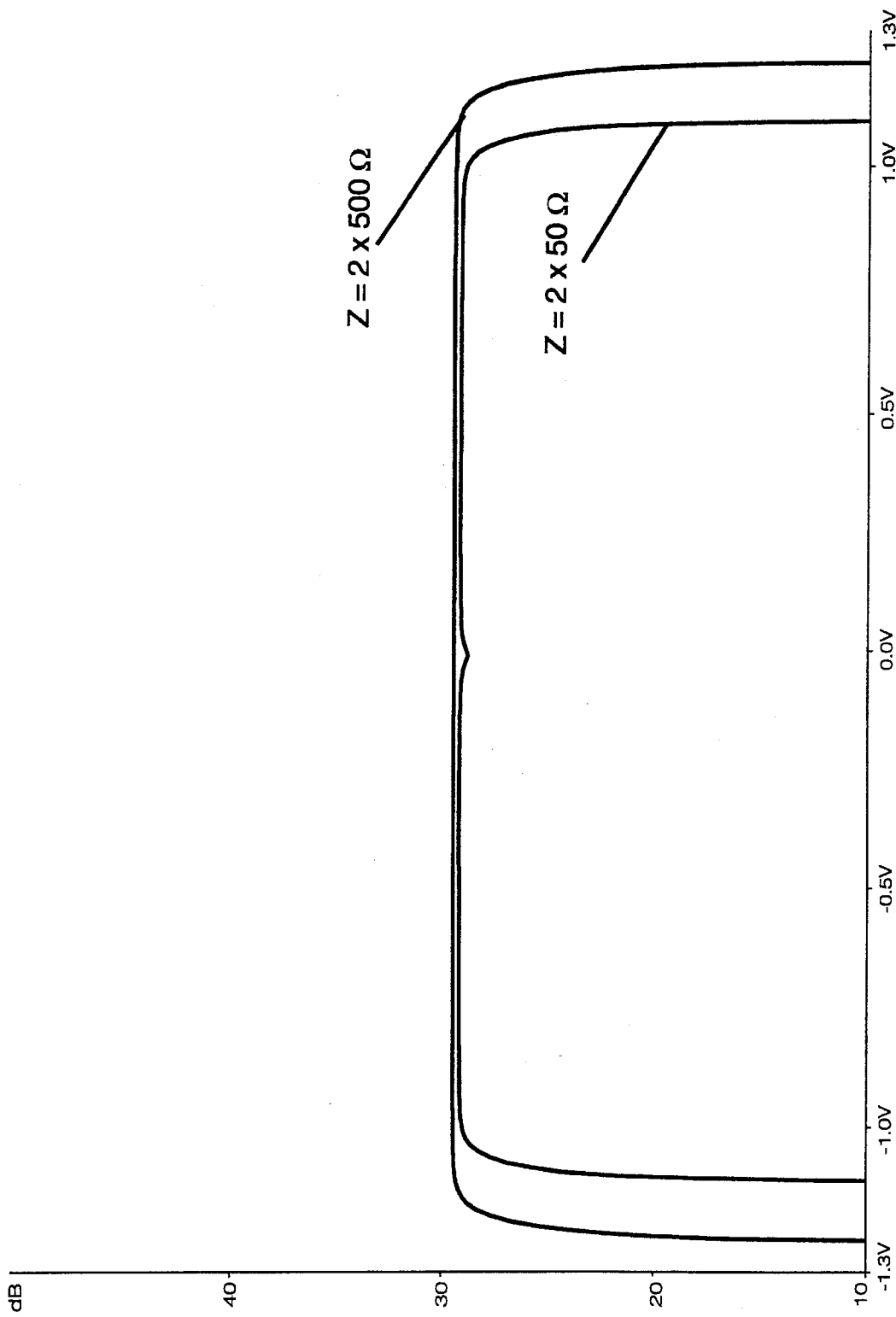

FIG. 4 shows the gain characteristic for the same impedances of Z=2×50 Ohm and Z=2×500 Ohm such as can be achieved with an amplifier designed in accordance with the invention. It is immediately possible to see that the overall gain is slightly less than 30 dB, as demanded, and that this is true both for the low impedance of Z=2×50 Ohm as well as for the higher impedance of Z=2×500 Ohm. Also, the amplitude of the AC voltage present at the transformer which produces a practically identical gain differs only slightly for the two impedances.

This shows that it has been possible to meet the demand for balanced gain without problems at both low impedances and high impedances, i.e. the circuit functions practically free of distortion at low impedances as well.

I claim:

1. Circuit arrangement for an integrated output amplifier (1), with two essentially identical constant current sources (2, 3), a voltage amplifier (4) with two inputs (5, 6) and two outputs (7, 8) and two essentially identical output transistors coupled with these, as well as two essentially identical feedback networks (9, 10) producing negative feedback which are connected between the output transistors (Q1, Q2) and the assigned input transistors of the voltage amplifier (4), characterized in that the output transistors (Q1, Q2) are actively driven at their base electrodes by the voltage amplifier (4), while the emitter electrodes are connected to ground and the collector electrodes to a load (22), in that the first two feedback networks (9, 10) are connected between the collectors of the output transistors (Q1, Q2) and the base electrodes of the corresponding input transistors of the voltage amplifier (4), in that a third feedback network (11) which controls the closed-circuit current is connected on the input side (12, 13) to the base electrodes of the output transistors and on the output side (14) with the base electrode of a transistor (Q3) acting as a current sink, whereby the emitter electrode of the latter is connected with ground and the collector electrode with an input (15) of a current splitting network (16), whereby said current splitting network is also provided with a signal input (17), and in that the current splitting network (16) has two parallel branches (18, 19) between which the current flowing through this network can be split, whereby said current is controlled by the signal at the signal input (17), and in that the branches (18 and 19) of the current splitting network (16) are connected on the one hand with the constant current sources (2 and 3) and on the other hand with the inputs (5 and 6) of the voltage amplifier (4).

2. Circuit arrangement in accordance with claim 1, characterized in that at least one of the feedback networks consists of passive, resistive components.

3. Circuit arrangement in accordance with claim 1, characterized in that the output power of the output amplifier (1) can be limited to a lower value than a maximum value by limiting the currents supplied by the constant current sources (2, 3).

4. Circuit arrangement in accordance with claim 2, characterized in that the output power of the output amplifier (1) can be limited to a lower value than a maximum value by limiting the currents supplied by the constant current sources (2, 3).

* * * * *